(12) United States Patent
Huang et al.

(10) Patent No.: US 8,071,976 B2
(45) Date of Patent: Dec. 6, 2011

(54) ORGANIC FIELD-EFFECT TRANSISTOR AND CIRCUIT

(75) Inventors: Qiang Huang, Dresden (DE); Tobias Canzler, Dresden (DE); Ulrich Denker, Dresden (DE); Ansgar Werner, Dresden (DE); Karl Leo, Dresden (DE); Kentaro Harada, Fukuoka (JP)

(73) Assignee: Novaled AG, Dresden (DE)

( * ) Notice: Subject to any disclaimer, the term of this patent is extended or adjusted under 35 U.S.C. 154(b) by 142 days.

(21) Appl. No.: 12/534,402

(22) Filed: Aug. 3, 2009

(65) Prior Publication Data
US 2010/0065833 A1 Mar. 18, 2010

(30) Foreign Application Priority Data
Aug. 4, 2008 (DE) .................. 10 2008 036 062

(51) Int. Cl.
*H01L 51/00* (2006.01)
(52) U.S. Cl. .................. 257/40; 257/288; 257/E51.005; 257/E51.006
(58) Field of Classification Search .................. 257/40, 257/288, E51.005, E51.006
See application file for complete search history.

(56) References Cited

U.S. PATENT DOCUMENTS

| | | |
|---|---|---|
| 4,356,429 A | 10/1982 | Tang |
| 4,769,292 A | 9/1988 | Tang et al. |
| 5,093,698 A | 3/1992 | Egusa |
| 5,500,537 A | 3/1996 | Tsumura et al. |
| 5,703,436 A | 12/1997 | Forrest et al. |
| 5,757,026 A | 5/1998 | Forrest et al. |
| 5,811,833 A | 9/1998 | Thompson |
| 5,840,217 A | 11/1998 | Lupo et al. |
| 5,917,280 A | 6/1999 | Burrows et al. |
| 5,969,474 A | 10/1999 | Aria |
| 5,989,785 A | 11/1999 | Ishihara et al. |
| 6,023,073 A | 2/2000 | Strite |
| 6,107,734 A | 8/2000 | Tanaka et al. |

(Continued)

FOREIGN PATENT DOCUMENTS
CA   2549309   9/2005
(Continued)

OTHER PUBLICATIONS

Adachi, C. et al., "Efficient electrophosphorescence using a doped ambipolar conductive molecular organic thin film," Organic Electronics 2, (2001), pp. 37-43.

(Continued)

*Primary Examiner* — Victor A Mandala
(74) *Attorney, Agent, or Firm* — Sutherland, Asbill & Brennan, LLP (57) ABSTRACT

The invention relates to an organic field-effect transistor, in particular an organic thin film field-effect transistor comprising a gate electrode, a drain electrode and a source electrode, a dielectric layer which is formed in contact with the gate electrode, an active layer made from an organic material which is in contact with the drain electrode and the source electrode and which is configured electrically undoped, a dopant material layer which contains a dopant material that is an electrical dopant for the organic material of the active layer, and a border surface region in which a planar contact is formed between the active layer and the dopant material layer, wherein mobility of similar electrical charge carriers, namely electrons or holes, in the dopant material layer is no more than half as great as in the active layer.

16 Claims, 7 Drawing Sheets

U.S. PATENT DOCUMENTS

| | | | |
|---|---|---|---|
| 6,274,980 B1 | 8/2001 | Burrows et al. | |
| 6,303,238 B1 | 10/2001 | Thompson et al. | |
| 6,310,360 B1 | 10/2001 | Forrest et al. | |
| 6,337,492 B1 | 1/2002 | Jones et al. | |
| 6,406,804 B1 | 6/2002 | Higashi | |
| 6,437,769 B1 | 8/2002 | Kohayashi | |
| 6,555,840 B1* | 4/2003 | Hudson et al. | 257/40 |
| 6,566,807 B1 | 5/2003 | Fujita et al. | |
| 6,573,651 B2 | 6/2003 | Adachi et al. | |
| 6,579,422 B1 | 6/2003 | Kasinuma | |
| 6,580,027 B2 | 6/2003 | Forrest et al. | |
| 6,589,673 B1 | 7/2003 | Kido et al. | |
| 6,645,645 B1 | 11/2003 | Adachi et al. | |
| 6,720,573 B2 | 4/2004 | Son et al. | |
| 6,734,457 B2 | 5/2004 | Yamazaki | |
| 6,806,124 B2* | 10/2004 | Klauk et al. | 438/149 |
| 6,835,470 B1 | 12/2004 | Magain | |
| 6,867,538 B2 | 3/2005 | Adachi et al. | |
| 6,878,297 B1 | 4/2005 | Berger | |
| 6,897,473 B1 | 5/2005 | Burroughes et al. | |
| 6,900,588 B2 | 5/2005 | Adachi et al. | |
| 6,908,783 B1 | 6/2005 | Kuehl et al. | |
| 6,911,666 B2 | 6/2005 | Voutsas et al. | |
| 6,933,522 B2 | 8/2005 | Lin | |
| 6,936,961 B2 | 8/2005 | Liao et al. | |
| 6,965,197 B2 | 11/2005 | Tyan | |
| 6,979,414 B2 | 12/2005 | Hosokawa | |
| 7,001,536 B2 | 2/2006 | Thompson et al. | |
| 7,067,840 B2* | 6/2006 | Klauk et al. | 257/40 |
| 7,074,500 B2 | 7/2006 | Pfeiffer et al. | |
| 7,161,292 B2 | 1/2007 | Leo | |
| 7,301,167 B2 | 11/2007 | Ko | |
| 7,473,410 B1 | 1/2009 | Huffman et al. | |
| 7,655,961 B2* | 2/2010 | Marrocco et al. | 257/184 |
| 2001/0033136 A1 | 10/2001 | Kawase | |
| 2002/0030440 A1 | 3/2002 | Yamazaki | |
| 2002/0041975 A1 | 4/2002 | Ueda et al. | |
| 2002/0048688 A1 | 4/2002 | Fukuoka et al. | |
| 2002/0071082 A1 | 6/2002 | Okita et al. | |
| 2002/0084993 A1 | 7/2002 | Teneya | |
| 2002/0098379 A1 | 7/2002 | Arakane | |
| 2002/0109136 A1 | 8/2002 | Seo et al. | |
| 2003/0020073 A1 | 1/2003 | Long et al. | |
| 2003/0042848 A1 | 3/2003 | Park et al. | |
| 2003/0052616 A1 | 3/2003 | Antoniadis et al. | |
| 2003/0067005 A1* | 4/2003 | De Leeuw et al. | 257/72 |
| 2003/0092232 A1* | 5/2003 | Klauk et al. | 438/200 |
| 2003/0098946 A1 | 5/2003 | Blaessing et al. | |
| 2003/0127973 A1 | 7/2003 | Weaver et al. | |
| 2003/0146443 A1 | 8/2003 | Yamazaki et al. | |
| 2003/0170491 A1 | 9/2003 | Liao et al. | |
| 2003/0178619 A1 | 9/2003 | Forrest et al. | |
| 2003/0189401 A1 | 10/2003 | Kido et al. | |
| 2003/0230980 A1 | 12/2003 | Forrest et al. | |
| 2004/0012980 A1 | 1/2004 | Sigiura et al. | |
| 2004/0032220 A1 | 2/2004 | Cok et al. | |
| 2004/0062949 A1 | 4/2004 | Pfeiffer et al. | |
| 2004/0067324 A1 | 4/2004 | Lazarev et al. | |
| 2004/0104394 A1 | 6/2004 | Lin et al. | |
| 2004/0113547 A1 | 6/2004 | Son et al. | |
| 2004/0119400 A1 | 6/2004 | Takahashi et al. | |
| 2004/0150330 A1 | 8/2004 | Suh et al. | |
| 2004/0183067 A1 | 9/2004 | Strip et al. | |
| 2004/0191952 A1 | 9/2004 | Shtein et al. | |
| 2004/0201018 A1 | 10/2004 | Yamahara et al. | |
| 2004/0214041 A1 | 10/2004 | Lu | |
| 2004/0227460 A1 | 11/2004 | Liao et al. | |
| 2004/0235209 A1 | 11/2004 | Hasegawa et al. | |
| 2004/0251816 A1 | 12/2004 | Leo et al. | |
| 2005/0029933 A1 | 2/2005 | Liao et al. | |
| 2005/0040390 A1 | 2/2005 | Pfeiffer et al. | |
| 2005/0040392 A1 | 2/2005 | Wu et al. | |
| 2005/0053801 A1 | 3/2005 | Eischner et al. | |
| 2005/0061232 A1 | 3/2005 | Werner et al. | |
| 2005/0073251 A1 | 4/2005 | Kato | |
| 2005/0086251 A1 | 4/2005 | Hatscher et al. | |
| 2005/0095736 A1 | 5/2005 | Padiyath et al. | |
| 2005/0110009 A1 | 5/2005 | Blochwitz-Nimoth et al. | |
| 2005/0118745 A1 | 6/2005 | Yamazaki et al. | |
| 2005/0173700 A1 | 8/2005 | Liao et al. | |
| 2005/0179399 A1* | 8/2005 | Leo et al. | 315/169.3 |
| 2005/0189875 A1 | 9/2005 | Nakada | |
| 2005/0218797 A1 | 10/2005 | Bechtel et al. | |
| 2005/0255334 A1 | 11/2005 | Kang et al. | |
| 2005/0269943 A1 | 12/2005 | Hack et al. | |
| 2005/0270279 A1 | 12/2005 | Giraldo et al. | |
| 2006/0033115 A1 | 2/2006 | Blochwitz et al. | |
| 2006/0038170 A1 | 2/2006 | Brunschwiler et al. | |
| 2006/0061266 A1 | 3/2006 | Kang et al. | |
| 2006/0065904 A1 | 3/2006 | Uemura et al. | |
| 2006/0081840 A1* | 4/2006 | Mori et al. | 257/40 |
| 2006/0145365 A1 | 7/2006 | Halls et al. | |
| 2006/0202196 A1 | 9/2006 | Kawakami et al. | |
| 2006/0231843 A1 | 10/2006 | Qin et al. | |
| 2006/0232992 A1 | 10/2006 | Bertram et al. | |
| 2006/0238112 A1 | 10/2006 | Kasama et al. | |
| 2006/0250076 A1 | 11/2006 | Hofmann et al. | |
| 2006/0273310 A1 | 12/2006 | Birnstock et al. | |
| 2007/0034860 A1 | 2/2007 | Nakamura et al. | |
| 2007/0051946 A1 | 3/2007 | Walzer et al. | |
| 2007/0278479 A1 | 12/2007 | Werner et al. | |
| 2008/0143250 A1 | 6/2008 | Blochwitz-Nimoth et al. | |
| 2008/0164807 A1 | 7/2008 | Hofmann et al. | |
| 2008/0203406 A1 | 8/2008 | He et al. | |
| 2009/0009071 A1 | 1/2009 | Murano et al. | |
| 2009/0009072 A1 | 1/2009 | Wellmann et al. | |
| 2010/0090202 A1* | 4/2010 | Obata et al. | 257/40 |
| 2010/0112751 A1* | 5/2010 | Marrocco et al. | 438/99 |
| 2011/0024731 A1* | 2/2011 | Takimiya et al. | 257/40 |

FOREIGN PATENT DOCUMENTS

| | | |
|---|---|---|
| DE | 19916745 | 10/2000 |
| DE | 10209789 | 9/2003 |
| DE | 10229231 | 1/2004 |
| EP | 1227466 | 7/2002 |
| EP | 1282101 | 2/2003 |
| EP | 1318499 | 6/2003 |
| GB | 2361356 | 10/2001 |
| GB | 2388236 | 11/2003 |
| GB | 2390215 | 12/2003 |
| GB | 2392023 | 2/2004 |
| JP | 5931865 | 2/1984 |
| JP | 03208689 | 9/1991 |
| JP | 07-142169 | 11/1993 |
| JP | 05-034692 | 12/1993 |
| JP | 11283750 | 10/1999 |
| JP | 2000-231992 | 8/2000 |
| JP | 2003203769 | 7/2003 |
| JP | 2003297561 | 10/2003 |
| JP | 2004119197 | 4/2004 |
| JP | 2004214120 | 7/2004 |
| JP | 2004234942 | 8/2004 |
| JP | 2005156925 | 6/2005 |
| KR | 0522687 | 10/2005 |
| TW | 200401017 | 1/2004 |
| WO | WO 99/48160 | 9/1999 |
| WO | WO 01/27910 | 4/2001 |
| WO | WO 02/37580 | 5/2002 |
| WO | WO 02/093664 | 11/2002 |
| WO | WO 03/069958 | 8/2003 |
| WO | WO 03/088271 | 10/2003 |
| WO | WO 2004/025615 | 3/2004 |
| WO | WO 2004/059606 | 7/2004 |
| WO | WO 2004/097954 | 11/2004 |
| WO | WO 2005/008801 | 1/2005 |
| WO | WO 2005/089288 | 9/2005 |

OTHER PUBLICATIONS

Adachi, C. et al., "High-efficiency organic electrophorescent devices with tris (2-phenylpyridine) iridium doped into electron-transporting materials," App. Phys. Lett. vol. 77, No. 6, Aug. 7, 2000.

Adachi, C. et al., "Nearly 100% internal phosphorescence efficiency in an organic light emitting device," Journal of Applied Physics (2001), vol. 90:10, pp. 5048-5051.

Adachi, et al. "Electroluminescence in Organic Films with Three-Layer Structure," Japanese Journal of Applied Physics, 27, L269 (1988).

Akiba, Kin-Ya et al., "Direct Synthesis of 2,2-diaryl-3-methyl-2,3-dihydrobenzothiazoles from 3-methyl-2,3-dihydrobenzothiazole-2-thione and some mechanistic aspects," Bulletin of the Chemical Society of Japan, vol. 52(1), pp. 156-159, (1979).

Ammermann, D. et al., "Photonic devices based on crystalline organic semiconductors for optoelectronic integrated circuits," Jps. J. Appl. Phys. Pt. 1 (1995) vol. 34, pp. 1293-1297.

Anderson, J.D. et al., "Electrochemistry and Electrogenerated Chemiluminescence Processes of the Componenets of Aluminum Quinolate/Triarylamine, and Related Organic Light emitting Diodes," J. Am. Chem. Soc., 1998, 120, pp. 9646-9655.

Baldo, et al. "Highly efficient phosphorescent emission from organic electroluminescent devices," Nature, vol. 395, Sep. 10, 1998, pp. 151-154.

Baldo, M. A. et al., "High efficiency fluorescent organic light-emitting devices using a phosphorescent sensitizer," Nature, (2000), vol. 403, pp. 750-753.

Baldo, M. A. et al., "Transient analysis of organic electrophosphorescence: I. Transient analysis of triplet energy transfer," Physical Review B, (2000), vol. 62:16, pp. 10958-10966.

Baldo, M. A. et al., "Very high-efficiency green organic light-emitting devices based on electrophosphorescence," Applied Physics Letters, (1999), vol. 75:1, pp. 4-6.

Baldo, M. A., et al., "Transient analysis of organic electrophosphorescence II. Transient analysis of triplet-triplet annihilation," Physical Review B, (2000), vol. 62:16, pp. 10967-10977.

Baldo, M., et al., "Organic vapor phase deposition," Advanced Materials, 1998, 10, No. 18, pp. 1505-1514.

Bandyopadhyay, A, et al. "Large conductance switching and memory effects in organic molecules for data-storage applications," Appl. Phys. Lett. 82, 1215 (2003).

Bard, A. J., Faulkner, R.J., Electrochemical Methods: Fundamentals and Applications, Wiley, 2nd Ed., 2000 (Chapter 2).

Bard, A. J., Faulkner, R.J., Electrochemical Methods: Fundamentals and Applications, Wiley, 2nd Ed., 2000 (Chapter 6).

Bastard, G., "Wave mechanics applied to semiconductor heterostructures," The Editions of Physique, (1988) pp. 64-67.

Baumgartel, H. et al. "Intracluster Electron and Proton Transfer in Ionic Ortho-Xylene/Dimethylamine Aggregates," Ber Bunsenges. Phys. Chem. 101, 783-788 (1997) No. 5.

Baumgartel, H. et al., "Polarographische Untersuchungen zur Konformation von 1.2.3.4.5-pentaarylimidazoliumkationen," Ber. Bunsenges (1972) 76/2, 94-100.

Bernanose, Andre et al. "Sur un nouvea mode d'emission lumineuse chez certains composes organiques," J. de Chimie Physique, 1953, No. 1, pp. 64-68.

Birnstock, J. et al., "High Efficiency Top Emitting OLEDs on a-Si Active Matrix Backplanes with Large Aperture Ratio," OLED1: Panel, IDW '04, Dec. 8, 2004.

Blochwitz, J. "Organic Light-Emitting Diodes with Doped Charge Transport Layers" Dissertation: Technische Universitat Dresden (2001). http://deposit.ddb.de/cgi-bin/dokserv?idn=963580051&dok_var=d1&dok_ext=pdf&filename=963580051.pdf.

Blochwitz, J. et al., "Interface electronic structure of organic semiconductors with controlled doping levels," Org. Electronics 2, 97 (2001).

Blochwitz, J., et al., "Low voltage organic light emitting diodes featuring doped phthalocyanine as hole transport material," Applied Physics Letters, vol. 73, No. 6, Aug. 10, 1998, pp. 729-731.

Blochwitz, J., et al., "Non-polymeric OLEDs with a doped amorphous hole transport layer and operating voltages down to 3.2 V to achieve 100 cd/m$^2$," Synthetic Metals, (2002), vol. 127, pp. 169-173.

Campbell, A. J. et al., "Dispersive electron transport in an electroluminescent polyfluorene copolymer measured by the current integration time of flight method," Applied Physics Letters, Oct. 1, 2001, vol. 79, No. 14 pp. 2133-2135.

Carter, S. A. et al., "Enhanced luminance in polymer composite light emitting devices," Appl. Phys. Lett., vol. 71, pp. 1145-1147, Sep. 1997.

Chung-Chih, Wu et al., "Efficient organic blue-light-emitting devices with double confinement on terfluorenes with ambipolar carrier transport properties," Advanced Materials, Jan. 5, 2004, vol. 16, No. 1, pp. 61-65.

Colle, M. et al. "Switching and filamentary conduction in non-volatile organic memories," Organic Electronics, 7, 305-312 (Oct. 2006).

Connelly, N. G. et al., "Chemical Redox Agents for Organometallic Chemistry," Chem. Rev., 96, 877 (1996).

Cotton, F. et al., "Closed-shell molecules that ionize more readily than cesium," Science, vol. 298, No. 5600, pp. 1971-1974 (Dec. 6, 2002).

D'Andrade, B.W. et al., "Relationship between the ionization and oxidation potentials of molecular organic semiconductors," Organic Electronics 6, 2005, pp. 11-20.

D'Andrade, Brian W., "Operational stability of electrophosphorescent devices containing p and n doped transport layers," Applied Physics Letters, vol. 83, No. 19, Nov. 10, 2003, pp. 3858-3860.

D'Andrade, Brian W., et al., "Efficient organic electrophosphorescent white-light emitting device with a triple doped emissive layer," Advanced Materials, No. 7, 16, Apr. 5, 2004. pp. 624-628.

D'Andrade, Brian W., et al., "High-efficiency yellow double-doped organic light-emitting devices based on phosphorsensitized fluorescence," Appl. Phys. Lett., (2001), vol. 79:7, pp. 1045-1047.

Day et al. "The use of charge transfer interlayers to control hole injection in molecular organic light-emitting diodes," Thin Solid Films, 410 (2002) pp. 159-166.

Dodabalapur et al., "Organic transistors: Two-dimensional transport and improved electrical characteristics," Science, vol. 268, p. 270 (1995).

Endo, Jun et al., "Organic Electroluminescent Devices with a vacuum-deposited Lewis Acid doped hole injecting layer," Japan Society of Applied Physics, vol. 41, 2002, pp. L358-L360, Part 2, No. 3B, Mar. 15, 2002.

Feng, X.D. et al. "Ohmic Cathode for Low-Voltage Organic Light-Emitting Diodes," App. Phys. Lett., vol. 86, Article 143511 (Apr. 1, 2005): pp. 1-3.

Gao, W. et al., "Effect of electrical doping on molecular level alignment at organic-organic heterojunctions," Applied Physics Letters, vol. 82, No. 26, Jun. 30, 2003, pp. 4815-4817.

Gu, G. et al., "Transparent organic light emitting devices," Applied Physics Letters, (1996), vol. 68:19, pp. 2606-2608.

Gu, G., et al. "Transparent stacked organic light emitting devices. I. Design principles and transparent compound electrodes," Journal of Applied Physics, 1999, vol. 86, No. 8, pp. 4067-4075.

Gufeng, et al., "Very high-efficiency and low voltage phosphorescent organic light-emitting diodes based on a p-i-n junction," Journal of Applied Physics, vol. 95, No. 10, pp. 5773-5777 (May 15, 2004).

Gufeng, He et al., "High-efficiency and low-voltage p-i-n electrophosphorescent organic light-emitting diodes with double-emission layers," Applied Physics Letters, vol. 85, No. 17, Oct. 25, 2004, pp. 3911-3913.

Hack, M. et al. "Status and Opportunities for High Efficiency OLED Displays on Flexible Substrates," Mater. Res. Soc. Symp. Proc., vol. 870E, Article H3.1, Symposium H Giant Area Electronics on Nonconventional Substrates (Mar. 28-Apr. 1, 2005): pp. 1-10.

Harada, K. et al. "Ionized impurity scattering in n-doped C60 thin films," Applied Physics Letters, 91, 092118 (2007).

Harada, K. et al. "Organic Homojunction Diodes with a High Built-in Potential: Interpretation of the Current-Voltage Characteristics by a Generalized Einstein Relation," Phys. Rev. Lett. 94, 036601 (2005).

Higgins, R.W.T. et al. "Emeraldine base polyaniline as an alternative to poly(3,4-ethylenedioxythiophene) as a hole-transporting layer," Advanced Functional Materials, 11, 407-412 (Dec. 1, 2001).

Hino, Yuichi et al., "Efficient low molecule phosphorescent organic light emitting diodes fabricated by wet-processing," Organic Electronics, Aug. 8, 2004, vol. 5, pp. 265-270.

Hong, Il-Hwa et al. "Effective hole injection of organic light-emitting diodes by introducing buckminsterfullerene on the indium tin oxide anode," Applied Physics Letters, 2005, 87, 063502-1.

Hu, Wenping et al., "Efficient red electroluminescence from devices having multilayers of a europium complex," Appl. Phys. Lett. vol. 77, No. 26, Dec. 25, 2000.

Huang, Jingsong et al., "Effect of well number on organic multiple-quantum-well electroluminescent device characteristics," Applied Physics Letters, (1998), vol. 73:23, pp. 3348-3350.

Huang, Jingsong et al., "Influence of the thickness and doping of the emission layer on the performance of organic light-emitting diodes with PiN structures," Journal of Applied Physics, (2003), vol. 93:2, pp. 838-844.

Huang, Jingsong et al., "Low operating voltage and high-efficiency organic multilayer electroluminescent devices with p-type doped hole injection layer," Jps. J. Appl. Phys., (2001), vol. 40, pp. 6630-6633.

Huang, Jingsong et al., "Low-voltage organic electroluminescent devices using pin structures," Applied Physics Letters, vol. 80, No. 1, Jan. 7, 2002, pp. 139-141.

Hughes, et al. "Electron transporting materials for organic electroluminescent and electrophosphorescent devices," Journal of Materials Chemistry (2005), vol. 15, pp. 94-107.

Hung, L.S. et al., "Recent progress of molecular organic electroluminescent materials and devices," Materials Science and Engineering Reports, 39, 2002, pp. 143-222.

Ikai, M. et al., "Highly Efficient Phosphorescence From Organic light-emitting devices with an exciton-block layer," Appl. Phys. Lett. vol. 79, No. 2, Jul. 9, 2001.

Ioannidis, A. et al., "Hole and electron transport in chloroaluminum phtalocyanin thin films," The Journal of Physical Chemistry B, 1997, vol. 101, pp. 5100-5107.

Ishii, M. et al., "Improvement of organic electroluminescent device performance by in situ plasma treatment of indium-tin-oxide surface," J. Lumin., 1165 (2000).

Kido, Junji; "Recent progress in organic light-emitting devices," Proceedings of the 1st International Display Manufacturing Conference IDMC 2000, Seoul Korea, Sep. 5, 2000, pp. 399-400.

Koch, N. et al., "Optimized hole Injection with Strong Acceptors at Organized-Metal Interfaces," Phys. Rev. Lett., vol. 95, pp. 237601-3, Nov. 30, 2005.

Krieger et al. "Molecular analogue memory cell based on electrical switching and memory in molecular thin films," Synthetic Metals, 122, 199-202 (May 2001).

Kwong, R.C. et al. "Current Status of Electrophosphorescent Device Stability," Org. Electr., vol. 4 (2003): pp. 155-164.

Kwong, Raymond C., et al., "High operational stability of electrophosphorescent devices," Applied Physics Letters, Jul. 1, 2002, vol. 81, No. 1, pp. 162-164.

Lambert, M.A., "Volume-controlled current injection in insulators," Rep. Progr. Phys. 27, 329 (1964).

Lee et al. "The Effect of C60 doping on the device performance of organic light-emitting diodes," Applied Physics Letters, 86 (2005) 063514 (3 pages).

Lee, et al. "Effects of hydroxyl groups in polymeric dielectrics on organic transistor performance," Applied Physics Letters, 88, 162109 (2006).

Liping, Ma et al. "Nonvolatile electrical bistability of organic/metal-nanocluster/organic system," Appl. Phys. Lett. 82, 1419-1421 (Mar. 3, 2003).

Lu, Ping et al., "Synthesis of octasubstituted cyclooctatetrainees and their use as electron transporters in organic light emitting diodes," Journal of the American Chemical Society, 2000, vol. 1222, pp. 7480-7486.

Lupton, J. M. et al., "Bragg scattering from periodically microstructured light emitting diodes," Appl. Phys. Lett., vol. 77, pp. 3340-3342, Nov. 2000.

Ma, E.Y., et al. "Thin Film Transistors for Foldable Displays," IEEE Technical Digest, Electron Devices Meeting, 1997. IEDM '97. (Dec. 7-10, 1997): pp. 535-538.

Madigan, C.F. "Improvement of Output coupling efficiency of organic light emitting diodes by backside substrate modification," Appl. Phys. Lett., vol. 76, pp. 1650-1652, Mar. 2000.

Maennig, B. et al. "Controlled p-type doping of polycrystalline and amorphous organic layers: Self-consistent description of conductivity and field-effect mobility by a microscopic percolation model," Physical Review B, 64, 195208 (2001).

Matsumura, M. et al., "Analysis of current-voltage characteristics of organic light emitting diodes having a LiF/Al cathode and an Al-hydroxyquinoline/diamine junction," Applied Physics Letters, 2872 (1998).

Mattoussi, H. et al., "Photoluminescence quantum yield of pure and molecularly doped organic solid films," Journal of Applied Physics, (1999), vol. 86:5, p. 2642.

Miller, L.L. et al., "A simple comprehensive correlation of organic oxidation and ionization potentials," J. Org. Chem., 1972, vol. 37, No. 6, pp. 916-918.

Mori, T. et al., "Electroluminescence of organic light emitting diodes with alternately deposited dye-doped aluminum quinoline and diamine derivative," Journal of Physics D—Applied Physics, (1999), vol. 32:11, pp. 1198-1203.

Murata, Hideyuki et al., "Efficient organic light-emitting diodes with undoped active layers based on silole derivatives," Applied Physics Letters, Jan. 14, 2002, vol. 80, No. 2, pp. 189-191.

Naito, Katsuyuki et al.; "Molecular design, synthesis, and physical properties of nonpolymeric amorphous dyes for electron transport," The Journal of Physical Chemistry A, 1997, vol. 101, pp. 2350-2357.

Ohmori, Yutaka et al., "Fabrication and characteristics of 8-hydroxyquinoline aluminum/aromatic diamine organic multiple quantum well and its use for electrluminescent diode," Applied Physics Letters, (1993), vol. 62:25, pp. 3250-3252.

Ohmori, Yutaka et al., "Observation of spectral narrowing and emission energy shift in organic electroluminescent diode utilizing 8-hydroxyquinoline aluminum/aromatic diamine multilayer structure," Applied Physics Letters, (1993), vol. 63:14, pp. 1871-1873.

Pacios, R., et al., "Charge separation in polyfluorene composites with internal donor/acceptor heterojunctions," Synthetic Metals, 2002, vol. 127, pp. 261-265.

Parker, "On the Problem of Assigning Values to Energy Changes of Electrode Reactions," Journal of the American Chemical Society, 96:17, Aug. 21, 1974, pp. 5656-5661.

Pfeiffer et al., "Controlled p-doping of pigment layers by cosublimation: Basic mechanisms and implications for their use in organic photovoltaic cells," Solar Energy Materials and Solar Cells, vol. 63, pp. 83-99, Jun. 1, 2000.

Pfeiffer, M, et al., "Doped Organic semiconductors: physics and application in light emitting diodes," Organic Electronics, Elsevier, Amsterdam, NL, vol. 4, No. 2/3, Sep. 2003, pp. 89-103, XP001177135, ISSN: 1556-1199.

Pfeiffer, M. et al., "Controlled doping of phthalocyanine layers by cosublimation with acceptor molecules: A systematic Seebeck and conductivity study," Applied Physics Letters, vol. 73, No. 22 Nov. 20, 1998, pp. 3202-3204.

Pfeiffer, Martin et al., "Electrophosphorescent p-i-n organic light-emitting devices for very-high-efficiency flat-panel displays," Advanced Materials, (2002), vol. 14:22, Nov. 18, 2002, pp. 1633-1636.

Pope, et al., "Single positive or negative carriers in organic crystals," Electronic Processes in Organic Crystals and Polymers, Oxford Science Publications, Oxford University Press, (1999), pp. 202-207.

Potember, R.S. et al. "Electrical switching and memory phenomena in Cu-TCNQ thin films," Appl. Phys. Lett. 34, 405 (1979).

Pudzich, R., et al., "Synthesis and characterization of new oxadizoleamine based spiro-linked fluorescence dyes," Synthetic Metals, 2003, vol. 138, pp. 21-31.

R. Schlaf et al., "Homo/Lumo Alignment at PTCDA/ZnPc and PTCDA/ClInPc Heterointerfaces Determined by Combined UPS and XPS Measurements," J. Phys. Chem. B 1999, 103, pp. 2984-2992.

Redecker, M., et al., "Electron transport in starburst phenylquinoxalines," Applied Physics Letters, Jul. 5, 1999, vol. 75, No. 1, pp. 109-111.

Sakamoto, Gosuke et al., "Significant improvement of device durability in organic light-emitting diodes by doping both hole transport and emitter layers with rubrene molecules," Applied Physics Letters, (1999), vol. 75:6, pp. 766-768.

Sato, N., et al., "Polarization Energies of Organic Solids Determined by Ultraviolet Photoelectron Spectroscopy," J. Chem. Soc. Faraday Trans. 2, 77, 1621 (1981).

Schnitzer, J., "30% External Quantum Efficiency from Surface Textured, Thin-film Light emitting diodes," Applied Phys. Lett., vol. 63, pp. 2174-2176, Oct. 1993.

Shinar, J. "Organic Light-Emitting Devices—A Survey" (Adachi et al. "Design concept of molecular materials for high-performance OLED" p. 43)) AIP-Press, Springer, New York 2004.

Shirota, Yasuhiko et al., "A novel class of emitting amorphous molecular materials as bipolar radical formants: 2- {4-[bis(4-methylphenyl)amino]phenyl} -5-(dimesitylboryl)thiophene) and 2-{4-[bis(9,9-dimethylfluorenyl)amino]phenyl} -5-(dimethylboryl)thiophene," Journal of the American Chemical Society, 2000, vol. 122, pp. 11021-11022.

Shirota, Yasuhiko; "Organic materials for electronic and optoelectronic devices," Journal of Materials Chemistry, 2000, vol. 10, pp. 1-25.

Signerski, et al. "The photovoltaic effect in a heterojunction of molybdenyl phthalocyanine and perylene dye," Journal of Non-Crystalline Solids, North-Holland Physics Publishing; vol. 352, No. 40-41, Nov. 1, 2006, pp. 4319-4324.

Tang, C. W., et al., "Electroluminescence of doped organic thin films," Journal of Applied Physics, (1989), vol. 65:9, pp. 3610-3616.

Tang, C.W. et al., "Organic electroluminescent diodes," Applied Physics Letters, vol. 51, No. 12, Sep. 21, 1987, pp. 913-915.

Tang, T.B. et al., "Ionization thresholds of merocyanine dyes in the solid state," Journal of Applied Physics, vol. 59, (1), Jan. 1986, pp. 5-10.

Tobat, P.; Saragi, I. et al., "Organic phototransfer based on intramolecular charge transfer in a bifunctional spiro compound," Applied Physics Letters, Mar. 29, 2004, vol. 84, No. 13, pp. 2334-2336.

Tokito, Shuzuo et al., "Improvement of emission efficiency in polymer light-emitting devices based on phosphorescent polymers," Thin Solid Films, Dec. 15, 2003, vol. 445, No. 2, pp. 353-357.

Tsutsui, T. et al., "High quantum efficiency in organic light emitting devices with iridium-complex as a triplet emissive center," Jps. Journal of Applied Physics, part 2 letters, (1999), vol. 38:12B, pp. L1502-L1504.

Tsuzuki, T. et al. "The effect of fullerene doping on photoelectric conversion using titanyl phthalocyanine and a perylene pigment," Solar Energy Materials and Solar Cells, Elsevier Science Publishers, Amsterdam, vol. 61, No. 1, Feb. 15, 2000; pp. 1-8.

Vissenberg, M.C. et al. "Theory of the field-effect mobility in amorphous organic transistors," Physical Review B, 27, 12964 (1998).

Volkel, A. R. et al. "Carrier transport and density of state distributions in pentacene transistors," Physical Review B, 66, 195336 (2002).

Wang, S.D. et al. "Bottom contact ambipolar organic thin film transistor and organic inverter based on $C_{60}$/pentacene heterostructure," Organic Electronics, 7 (2006) pp. 457-464.

Werner, A. G. et al., "Pyronin B as a donor for n-type doping of organic thin films," Applied Physics Letters, vol. 82, No. 25, Jun. 23, 2003, pp. 4495-4497.

Werner, A.G. et al., "n-Type Doping of Organic Thin Films Using Cationic Dyes," Adv. Funct. Mater., vol. 14, No. 3 (Mar. 2004): pp. 255-260.

Wu, C.C. et al. "Integration of Organic LEDs and Amorphous Si TFTs Onto Flexible and Lightweight Metal Foil Substrates," IEEE Electron Device Letters, vol. 18, No. 12 (Dec. 1997): pp. 609-612.

Yamamoria, A et al., "Doped Organic Light Emitting Diodes having a 650-nm Thick Hole Transport Layer," Appl. Phys. Lett. vol. 72, No. 17 (Apr. 27, 1998); pp. 2147-2149.

Yamasaki, T. et al., "Organic Light emitting device with an ordered monolayer of silica microspheres as a scattering medium," Appl. Phys. Lett., vol. 76, pp. 1243-1245, Mar. 2000.

Yang, et al., 2003, "Self-assembly and Magnetic Properties of Cobalt Nanoparticles," Appl. Phys. Lett., 82(26): 4729.

Yang, Y. et al. "Organic electrical bistable devices and rewritable memory cells," Appl. Phys. Lett. 80, 2997 (2002).

Yao, Fu et al., "Quantum-chemical predictions of Absolute standard redox potentials of diverse organic molecules and free radicals in acetonitrile," J. Am. Chem. Soc. 2005, 127, pp. 7227-7234.

Yuan et al. "Fullerene-doped hole transport molecular films for organic light-emitting diodes," Applied Physics Letters, 86 (2005) 143509 (3 pages).

Zhi-Ming, Zhang; "Organic light emitting diodes based on new oxadiazole and pyrazoline derivatives," China Physics Letters, 2000, vol. 17, No. 6, pp. 454-456.

Zhou, X et al., "Enhanced hole Injection Into Amorphous Hole-Transport Layers of Organic Light-Emitting Diodes Using Controlled p-Type Doping," Adv. Funct. Mater., 2001, 11, No. 4, pp. 310-314.

Zhou, X. et al., "Low-voltage inverted transparent vacuum deposited organic light-emitting diodes using electrical doping," Applied Physics Letters, vol. 81, No. 2, Jul. 29, 2002, pp. 922-924.

Zhou, X., et al. "High-efficiency electrophosphorescent organic light-emitting diodes with double light-emitting layers," Applied Physics Letters, Nov. 18, 2002, vol. 81, No. 21, pp. 4070-4072.

Final Office Action, U.S. Appl. No. 11/426,798; Dec. 30, 2009.
Non-Final Office Action, U.S. Appl. No. 11/426,798; Jun. 24, 2009.
Restriction Requirement, U.S. Appl. No. 11/426,798; Mar. 10, 2009.
Response to Office Action, U.S. Appl. No. 11/426,798; Oct. 22, 2009.
International Search Report for PCT/EP2007/003311; Nov. 1, 2007.
European Search Report and Opinion for EP05028081.7; May 18, 2006.
International Search Report for PCT/EP2006/012403; Mar. 28, 2007.
International Search Report for PCT/DE2005/001076; Dec. 20, 2005.
Canadian Search Report for Application No. 2543276; Aug. 24, 2009.
Non-final Office Action for U.S. Appl. No. 11/279,514; Jan. 14, 2010.
Response to Office Action for U.S. Appl. No. 11/279,514; Aug. 12, 2009.
Final Office Action for U.S. Appl. No. 11/279,514; May 13, 2009.
Response to Office Action for U.S. Appl. No. 11/279,514; Feb. 27, 2009.
Non-final Office Action for U.S. Appl. No. 11/279,514; Oct. 30, 2008.
Restriction Requirement for U.S. Appl. No. 11/279,514; Jul. 2, 2008.
Supplemental Notice of Allowability for U.S. Appl. No. 10/515,935; Jul. 27, 2007.
Notice of Allowance for U.S. Appl. No. 10/515,935; Jun. 5, 2007.
Office Action for U.S. Appl. No. 10/515,935; Aug. 14, 2006.
International Search Report for PCT/EP2007/011353; Apr. 28, 2008.
International Search Report for PCT/DE2006/000328; May 19, 2006.
Non-Final Office Action for U.S. Appl. No. 12/158,582; Feb. 4, 2010.
International Search Report for PCT/EP2006/012517; Mar. 20, 2007.
International Search Report for PCT/EP2007/000211; Mar. 12, 2007.
European Search Report/Opinion for EP 06026743.2; Nov. 7, 2007.
International Search Report for PCT/DE2005/001493; Jan. 19, 2006.
International Search Report for PCT/DE2008/000638; Sep. 11, 2008.
Non-Final Office Action for U.S. Appl. No. 11/421,249; Oct. 19, 2009.
Response to Office Action for U.S. Appl. No. 11/421,249; Aug. 20, 2009.
Final Office Action for U.S. Appl. No. 11/421,249; May 20, 2009.
Response to Office Action for U.S. Appl. No. 11/421,249; Mar. 18, 2009.
International Search Report for PCT/EP2006/012516; Mar. 27, 2007.
Non-Final Office Action for U.S. Appl. No. 11/574,058; Dec. 9, 2009.
Disclosure Under 37 C.F.R. 1.56 for U.S. Appl. No. 12/534,402 Submitted Herewith.

* cited by examiner

ORGANIC FIELD-EFFECT TRANSISTOR AND CIRCUIT

CROSS-REFERENCE TO RELATED APPLICATION

Applicants hereby claim priority under 35 U.S.C. 119(a) to German Patent Application No. 102008036062.7, filed Aug. 4, 2008, the disclosure of which is expressly incorporated herein by reference in its entirety.

FIELD OF THE INVENTION

The invention relates to an organic field-effect transistor, in particular an organic thin film field-effect transistor.

BACKGROUND OF THE INVENTION

Organic semiconductors have attracted a great deal of attention in recent years, due to their low cost, the possibilities for depositing them on large flat, flexible substrates, and the enormous choice of suitable molecules. Organic semiconductors can be used in switchable components such as transistors and in optoelectronic components, such as organic light-emitting diodes (OLEDs) and photovoltaic cells.

Organic transistors and, in particular, organic field-effect transistors (OTFTs) have been the subject of investigation and development for many years. It is expected that OTFTs will be usable on a large scale, for example, in low-cost integrated circuits for identification tags (RFID) and for screen control (backplane) applications. In order to enable low-cost applications, thin film technology is generally required for producing the transistors. Over the last few years, performance characteristics have improved to such an extent that the commercialization of organic transistors is foreseeable. For example, high field-effect mobility values of up to 6 $cm^2/Vs$ have been found in OTFTs for electrons based on fullerene-C60 and up to 5.5 $cm^2/Vs$ for holes based on pentacene.

Charge-carrier transport in thin organic films is generally described in terms of temperature-activated charge carrier hopping, which leads to relatively low charge carrier mobility and a strong influence of disorder. Therefore the field-effect mobility in OTFTs generally depends on the charge carrier density. For this reason, a relatively high gate voltage is usually necessary in order to fill localized states and to achieve high charge carrier mobility in the organic layer.

One possibility for increasing charge carrier density and thus charge carrier mobility in organic semiconductors is electrical doping by means of donors or acceptors. This brings about a change in the Fermi level of the semiconductor and, depending on the type of donor used, an increase in the initially very low conductivity by generating charge carriers in a matrix material. U.S. Pat. No. 5,093,698 describes the general requirements placed on a combination of organic materials for electrical doping.

In the last few years, electrical doping of organic semiconductors by means of molecular dopants has been investigated in detail. These investigations have shown that the charge carrier mobility of mixed layers increases depending on the doping concentration. This phenomenon is thereby explained that additional charge carriers gradually fill states of the matrix material from the lower end of the state density distribution, that is, states with lower charge carrier mobility. Equally, the Fermi level of the semiconductor is gradually changed, depending on the type of dopant used. It is increased for n-type doping and reduced for p-type doping, so that an increase in the initially very low conductivity is achieved.

In OTFTs with an electrically doped active layer, as the charge carrier mobility increases, the threshold voltage falls and with it, quite generally, the operating voltage. For most areas of application of OTFTs, it is desirable to achieve very low OFF currents. A high doping concentration leads to a high background charge density which, in turn, leads to an undesirable ohmic charge carrier transport which, due to the field effect, cannot be effectively controlled.

The OFF state of a transistor is understood to be an applied gate voltage of less than the threshold voltage of the component for the n-type conductor and of greater than the threshold voltage for the p-type conductor. For the widely investigated OTFT of the enhancement type, the OFF state exists at a gate voltage $V_g=0$ V for p-type and n-type.

However, it has also been found that in semiconductor layers with excellent charge carrier mobility, the mixing in of dopants leads to an increase in impurity scattering and thereby also restricts the maximum charge carrier mobility in OTFTs. (Harada et al., Appl. Phys. Lett. 91 092118 (2007)). An alternative arrangement wherein the background charge carrier concentration is enhanced without dopants being mixed into the semiconductor layer is therefore desirable. An arrangement of this type makes it possible, in principle, to increase the charge carrier mobility beyond the usual extent.

Methods for determining charge carrier mobility in a field-effect transistor are per se known in various embodiments. One example is described by US 2004/191952 A by Shtein et al. From the saturation region of a current-voltage graph between the source and drain electrodes, the charge carrier mobility is calculated for a particular gate voltage.

OTFTs with additional layers arranged on the active semiconductor layer, also designated encapsulation layers or cover layers, have been described. Examples are double layers of pentacenes and fullerene C60, in order to achieve ambipolar component functionality (Wang et al., Org. Electron. 7, 457 (2006)). In this special case, it can be deduced from the energy level that no technically relevant change in the charge carrier density takes place in the active layer. In US 2007/034860 A1 Nakamura et al. describe a structure of this type which even has a greater charge carrier mobility in the active layer compared with the encapsulation layer.

U.S. Pat. No. 5,500,537 by Tsumura et al. describes, inter alia, an OTFT structure wherein a further layer, similar to an encapsulation layer, is applied to the active layer. The requirement placed on the active layer is that it should be a polymer layer. The requirement placed on the further layer is that it controls the conductivity of the active layer. This requirement is actually too general for a switchable component. The proposed arrangement can only function in geometries wherein the source/drain contacts are not in direct contact with the other layer of higher conductivity, since otherwise large OFF currents would be inevitable.

US 2006/0202196 by Kawakami et al. describes structures with an encapsulation layer, which is configured as an electrically homogeneously doped layer, wherein the matrix material of the encapsulation layer is the same as or similar to the material of the active layer. This means that the charge carrier mobilities of the active layer and the encapsulation layer are the same or at least similar and that the electrical conductivity of the encapsulation layer is even greater than the electrical conductivity of the active layer in the OFF state, due to the electrical doping. The doped layer also acts as a parallel resistor and very severely impairs the ON/OFF ratio.

SUMMARY OF THE INVENTION

It is an object of the invention to provide an improved organic field-effect transistor wherein a high degree of mobility of the Charge carriers is made available.

This aim is achieved, according to the invention with an organic field effect transistor, in particular organic thin film field effect transistor, comprising a gate electrode, a drain electrode, and a source electrode; a dielectric layer which is formed in contact with the gate electrode; an active layer made from an organic material which is in contact with the drain electrode and the source electrode and which is configured electrically undoped; a dopant material layer which contains a dopant material that is an electrical dopant for the organic material of the active layer; and a border surface region in which a planar contact is formed between the active layer and the dopant material layer; wherein a mobility of similar electrical charge carriers, namely electrons or holes, in the dopant material layer is no more than half as great as in the active layer. Advantageous embodiments of the invention are the subject matter of the dependent subclaims.

The invention makes use of the concept of an organic field-effect transistor, in particular an organic thin film field-effect transistor comprising a gate electrode, a drain electrode and a source electrode, a dielectric layer which is formed in contact with the gate electrode, an active layer made from an organic material which is in contact with the drain electrode and the source electrode and which is configured electrically undoped, a dopant material layer which contains a dopant material that is an electrical dopant for the organic material of the active layer, and a border surface region in which a planar contact is formed between the active layer and the dopant material layer, wherein mobility or similar electrical charge carriers in the dopant material layer is no more than half as great as in the active layer.

An organic material or an inorganic material can be used as the dopant material. The organic material of the active layer and the dopant material in the dopant material layer form a combination of materials wherein, if they are arranged mixed in one layer, electrical doping of the organic material based on a partial charge transfer between the two materials takes place. However, with the organic field-effect transistor proposed here, the organic material is situated in the active layer, whereas the dopant material is included in the dopant material layer. In the dopant material layer itself, the dopant material does not bring about any electrical doping in this sense.

The dopant material can be an electrical dopant for the organic material of the active layer in the form of an acceptor or a donor. In the case where the electrical dopant is configured as a donor, an organic field-effect transistor of the n-type is formed.

The properties of the various materials involved in an electrical doping process can also be described in terms of the energy levels of the lowest unoccupied molecular orbital (LUMO, synonym: ionization potential) and of the highest occupied molecular orbital (HOMO, synonym: electron affinity).

One method for determining the ionization potential (IP) is ultraviolet photoelectron spectroscopy (UPS). In general, ionization potentials are determined for solid bodies, but it is also possible to measure ionization potentials in the gaseous phase. The values differ due to solid body effects, such as those which arise in the photoionization process. A typical value for the polarization energy is approximately 1 eV, although larger deviations can arise. The ionization potential relates to the beginning of the photoemission spectrum in the region of the high kinetic energies of the photoelectrons, that is, the energy of the most weakly bound photoelectrons. An associated method, inverted photoelectric spectroscopy (IPES), can be used for determining electron affinities (EA). However, this method is not widespread. Alternatively, solid body energy levels can be determined in solution by electrochemical measurement of oxidation potentials (Eox) or reduction potentials (Ered). A suitable method is cyclic voltammetry. Empirical methods for deriving the solid body ionization potential from an electrochemical oxidation potential are known from the literature.

No empirical formulae are known for the conversion of reduction potentials into electron affinities. This is related to the difficulty of determining electron affinities. For this reason, the following simple rule is often used: IP=4.8 eV+e*Eox (see ferrocene/ferrocenium) or EA=4.8 eV+e*$E_{red}$ (vs. ferrocene/ferrocenium). In the event that other reference electrodes or redox pairs are known for referencing the electrochemical potentials, conversion methods are known.

It is usual to employ the terms "Energy of the HOMO" E(HOMO) or "Energy of the LUMO" E(LUMO) as synonyms for the terms ionization energy and electron affinity (Koopmans' Theorem). It should be noted that the ionization potentials and electron affinities are such that a higher value means stronger binding of an electron released therefrom or captured thereby. Thus, as a global approximation, the following formula applies: IP=−E(HOMO) and FA=−D (LUMO).

The term "doping" is understood throughout the document to mean electrical doping, also known as redox doping.

An organic p-type field-effect transistor is formed when the electrical dopant is an acceptor for the organic material of the active layer.

Usually the electrodes and the plurality of layers of the organic field-effect transistor are formed on a substrate, for example, as thin films. It can be provided that one or more of the electrodes are provided by the substrate itself, for example by using a silicon substrate. The drain and source contact or alternatively the gate electrode, can be formed on or in the substrate.

The provision of the dopant material in the dopant material layer which is in direct contact with the active layer has the result that the Fermi level of the active layer is modified, meaning that charge carriers are induced in this electrically undoped layer, and this can be designated "quasi-doping". The induced charge carriers preferably till deep-lying levels of the state density distribution of the active layer and are not, or are only partially, available in the active layer as free charge carriers. Compared with the electrically doped active layers of the prior art, this has the advantage that no, or only negligibly few, freely mobile charge carriers find their way into the conduction channel which forms between the source and the drain electrodes during operation. The field-effect mobility of the transistor is increased by filling impurities without additional impurities being created. The creation of additional fault sites, which is avoided in this case, does occur in the electrically doped layers of the prior art. In the prior art, mixed layers of the dopant material and the matrix material are formed.

Furthermore, with the proposed configuration, the threshold voltage and the operating voltage of the organic field-effect transistor are reduced.

The doping is preferably carried out such that the OFF current is not greatly increased. Mobility is raised, but not the density of the charge carriers in the OFF state, which could reduce the field-effect and make the transistor unusable. The greater the ON/OFF ratio of a transistor, the smaller is the lowest operating voltage of a circuit. This is significant, in particular, for circuits of very low power, such as RFID tags.

In order to create less doping or "remote" doping, the concentration of dopant in a non-doped mixed layer can be kept very low. Or, an insulating layer/an undoped layer is arranged so that the dopant material is further removed from the conduction channel.

The dopant material layer can be formed as a non-closed layer or a closed layer. The closed or non-closed layer which can be formed, for example, from a plurality of separate partial regions, can be limited to a partial region of the extent of the layer stack of the transistor.

A preferred development of the invention provides that the dopant material layer comprises a dopant material.

In a suitable embodiment of the invention, it can be provided that the dopant material in the dopant material layer is embedded in a matrix material for which the organic dopant material is not an electrical dopant. Preferably, the HOMO of the n-type dopant material is energetically approximately 0.5 eV lower than the LUMO of the matrix material. It may also be suitable if the LUMO of the p-type dopant material is energetically approximately 0.5 eV higher than the LUMO of the matrix material, so that the energy difference for charge transfer between the dopant material and the matrix material is greater than approximately 0.5 eV.

A suitable embodiment of the invention can provide that the matrix material for which the embedded organic dopant material is not an electrical dopant, is an insulator (for electronic purposes).

An advantageous embodiment of the invention provides that the dopant material layer is configured with multiple layers, wherein one partial layer comprises the dopant material and another partial layer, which is arranged between the partial layer and the active layer and is in contact with the partial layer and the active layer, comprises a matrix material which transports the charge carrier. The further partial layer prevents direct contact of the dopant material with the active layer, so that diffusion of molecules of the dopant material into the active layer and changes to the properties of the transistor evoked thereby are prevented. This development is particularly preferable in the case where a thermally unstable and therefore volatile dopant material is used. Another development of the invention provides that the further partial layer is an insulator (for electronic purposes).

Preferably, a development of the invention provides that the matrix material transporting charge carriers is a material which preferably transports electrons.

In an advantageous embodiment of the invention, it can be provided that the matrix material transporting charge carriers is a material which preferably transports holes.

A development of the invention can provide that the dopant material layer is formed in direct contact with the drain electrode and the source electrode.

In a suitable embodiment of the invention, it can be provided that, in a switched-on state in which the conduction channel is formed in the active layer, an electrical conductivity in the active layer is greater than in the dopant material layer by at least a factor of two. It is preferably provided, in one development, that the electrical conductivity of the active layer and the dopant material layer differ from one another by several orders of magnitude.

An advantageous embodiment of the invention provides that the dopant material is a molecular dopant material which comprises at least two different atoms.

Preferably, a development of the invention provides that the molecular dopant material has a molar mass of between approximately 100 g/mol and approximately 2000 g/mol and preferably between approximately 200 g/mol and approximately 1000 g/mol.

In an advantageous embodiment of the invention, it can be provided that an energetic difference between the highest occupied orbital of the molecules (HOMO) of the organic material of the active layer and the lowest unoccupied orbital of the molecules (LUMO) of the dopant material is greater than approximately −0.5 eV if the dopant material for the organic material of the active layer is an acceptor. This then constitutes p-type doping.

In another development of the invention it can be provided that an energetic difference between the lowest unoccupied orbital of the molecules (LUMO) of the organic material of the active layer and the highest occupied orbital of the molecules (HOMO) of the dopant material is less than approximately 0.5 eV if the dopant material for the organic material of the active layer is a donor. This then constitutes n-type doping.

A suitable embodiment of the invention can provide that the LUMO of the p-dopant material is energetically approximately 0.5 eV higher than the energy level of the HOMO of the matrix material, for which the embedded organic dopant material is not an electrical dopant.

A suitable embodiment of the invention provides that the HOMO of the n-type dopant material has an energy level approximately 0.5 eV lower than the energy level of the LUMO of the matrix material, for which the embedded organic dopant material is not an electrical dopant.

It is preferable that the HOMO of the n-type dopant material is energetically approximately 0.3 eV lower than the LUMO of the organic material of the active layer. It may also be suitable that the LUMO of the p-type dopant material is energetically approximately 0.3 eV higher than the LUMO of the organic material of the active layer.

An advantageous embodiment of the invention provides that the dopant material is configured as an encapsulation layer.

Another development of the invention preferably provides that the encapsulation layer is formed free from direct contact with the drain electrode and the source electrode. In this embodiment, the active layer can be configured covering the drain and source electrodes.

Another advantageous embodiment of the invention provides that the dopant material layer is configured as a charge carrier injection layer in direct contact with the drain electrode and the source electrode.

A development of the invention provides that the dopant material is a p-type dopant with a reduction potential of equal to or greater than approximately 0 V vs. Fc/Fc+ as compared with the organic material of the active layer.

In one embodiment of the invention, it can be provided that the dopant material is an n-type dopant with an oxidation potential of not more than −1.5 V vs. Fc/Fc+ as compared with the organic material of the active layer.

A development of the invention preferably provides that the molecular dopant material comprises more than six atoms and preferably more than twenty atoms.

In another embodiment, it can be provided that the dopant material has a glass transition temperature (Tg) of greater than 75° C., and preferably greater than 100° C., and more preferably greater than 200° C. By this means, more stable electrical properties are created. By means of a high Tg the diffusion from the dopant material is minimized and the layers retain their original properties and functions.

It is advantageous if the dopant material layer is thermally stable, which reinforces the thermal stability of the organic field effect transistor. Good thermal stability is provided, in particular, if the molecule has a large molar mass, a larger number of atoms and a higher Tg. This can be measured by slowly increasing the ambient temperature for the temperature, for example from room temperature to approximately 300° C., for example, in steps of 1° C., and measuring the current for a given source-drain voltage and a given gate voltage. A large deviation or abrupt deviation of the current indicates the maximum temperature at which the transistor is still stable (Tstab).

It is advantageous if, due to the layered construction (or the individual layers) thermal stability (Tstab) of greater than 75° C. results. Tstab is preferably greater than 100° C., with the result that the transistor can also be used at higher temperatures and larger electrical currents. It is also advantageous if the individual materials have a sublimation temperature, independently of one another, of more than 100° C.

The layers are typically manufactured by means of vacuum evaporation, for example, VTE (vacuum thermal evaporation) or OVPD (organic vapor phase deposition). Vacuum spray methods can also be used. Another deposition method comprises the thermally or optically induced carrying-over of material from a carrier substrate to the actual substrate, for example, by means of LITI (laser induced thermal imaging). Doped layers are typically manufactured in a vacuum by means of mixed evaporation from two independently regulated sources for matrix material and dopant. Alternatively, they can be made by means of interdiffusion from a dopant layer into the matrix material layer lying thereunder, wherein the two materials are vapor deposited sequentially in a vacuum. The interdiffusion can also be controlled thermally. Under certain circumstances, the dopant must be activated during the manufacturing process or in the layer by suitable physical and/or chemical measures, for example, by the action of light or the effect of magnetic and/or electric fields.

Alternative manufacturing methods for doped layers are:
Doping of a matrix layer with a solution of dopants and subsequent evaporation of the solvent, particularly by thermal treatment.
Surface doping of a matrix material layer with a layer of dopant applied to the surface.
Manufacture of a solution of matrix molecules and dopants and subsequent manufacture of a layer made from this solution by means of conventional methods, for example, evaporation of the solvent or spin-on deposition.

The doping can possibly be carried out in that the dopant is evaporated from a precursor compound which releases the inventive compound during heating and/or irradiation. It should be understood that the release of the inventive dopant can also take place in the matrix.

From the document "Application of redox doping in OTFTs" in SID Optics+Photonics proceedings (Canzler et al.) 2008, the use of dopant material as an injection layer in OTFTs is known. With this surface change, it is possible to prevent the injection of one charge carrier type and simultaneously to enable or even improve the injection of the other charge carrier type. This enables an improved ON/OFF current ratio. This effect can be used in combination in order to optimize complementary circuits.

The proposed transistor can be used in improved circuits, for example, a complementary logic circuit, an oscillator, a ring oscillator, a frequency doubler, an inverter, a flip-flop, a digital logic component, a driver stage for display technology and an analogue amplifier. With low-level integration, circuits comprising 5 to 100 transistors can be manufactured. With larger integration, circuits with more than 100 transistors can be made. And with high integration, circuits with more than 100, and preferably more than 1000 transistors can be produced.

Circuits with a low current consumption require complementary outputs. If the output is at logic level 1 (positive voltage), the internal current path to earth is interrupted (prevented); if the output is at logical level 0 (negative voltage zero or very low positive voltage in relation to the voltage of logic level 1), then the internal current path to the positive voltage is interrupted (prevented). These complementary digital outputs can be created in simple manner with two transistors, wherein one is of the n-type and other of the p-type. A simple component is an inverter wherein the gate connections of both transistors are electrically connected.

The invention provides for a complementary transistor circuit in that, according to the invention, the n-type transistor contains an n-type dopant material layer and, according to the invention, a p-type transistor contains a p-type dopant material layer according to the invention. By this means, the charge carrier mobilities are increased in both transistors.

DETAILED DESCRIPTION OF EMBODIMENTS

The invention will now be described in greater detail by reference to exemplary embodiments, illustrated by drawings, in which.

Figure 1:
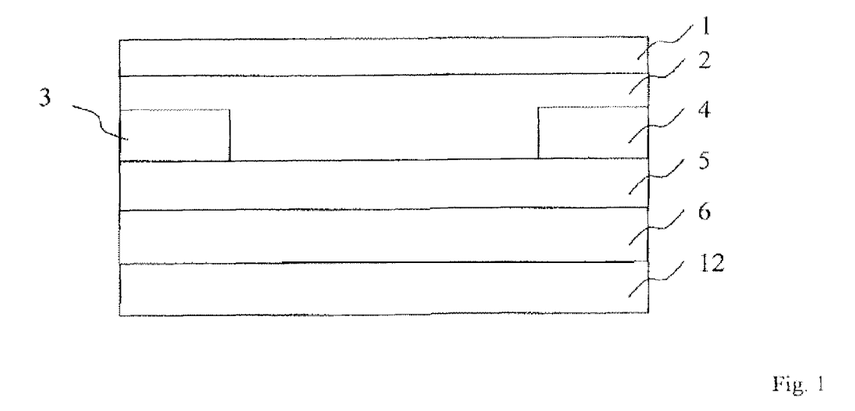
FIG. 1 is a schematic illustration of the structure of an organic field-effect transistor with a dopant material layer configured as an encapsulation layer.

FIG. 1 shows a schematic representation of an organic field-effect transistor with a dopant material layer embodied as an encapsulating layer 1 in this embodiment, an active layer 2 made from organic material and formed thereunder, a source electrode 3, a drain electrode 4, a dielectric layer 5 and a gate electrode 6, and an optional substrate 12. The same reference signs as in FIG. 1 are used for the schematic representation of another organic field-effect transistor in FIG. 2.

Figure 2:
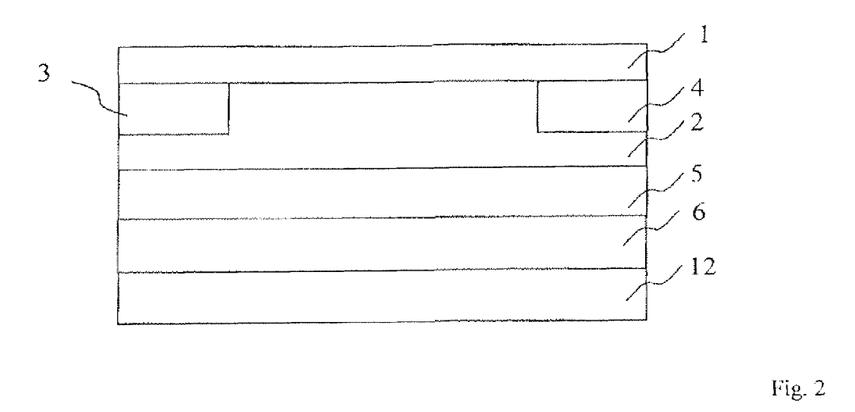
FIG. 2 is a schematic illustration of the structure of a further organic field-effect transistor wherein the encapsulation layer is in contact with a source electrode and a drain electrode.

Whereas the dopant material layer 1 is exclusively in direct contact with the active layer 2 in the organic field-effect transistor of FIG. 1, in the embodiment of FIG. 2, there is also a direct contact with the source electrode 3 and the drain electrode 4.

Figure 3:
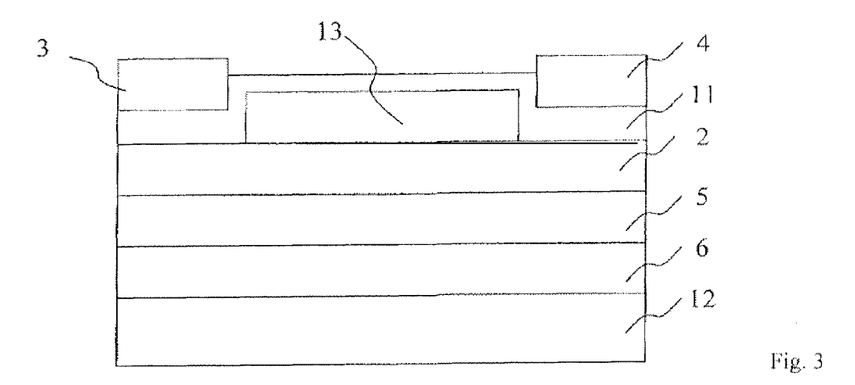
FIG. 3 is a schematic illustration of the structure of a further organic field-effect transistor comprising a dopant material layer configured as a charge carrier injection layer.

FIG. 3 shows a schematic representation of another field-effect transistor with the dopant material layer configured in this embodiment as charge carrier injection layer 11. The same reference signs are used for the schematic representation in FIG. 3 as in FIGS. 1 and 2. FIG. 3 also shows a substrate 12 of the organic field-effect transistor. A partial layer 13 comprising a matrix material is also embedded in the charge carrier injection layer 11.

In the embodiments shown, the gate electrode 6 is formed on the substrate 12. It can also be provided that the gate electrode is made available with the substrate itself, for example, using a silicon substrate. Alternatively, it can be provided (not shown) that the drain contact and the source contact are formed on the substrate.

In the different embodiments of organic field-effect transistors, each dopant material-layer comprises a dopant material the molecules of which comprise electrical dopants for the organic material of the respective active layer 2, whether in the form of acceptors or in the form of donors, but without the dopant material itself acting in electrically doping manner in the dopant material layer.

Figure 4A:
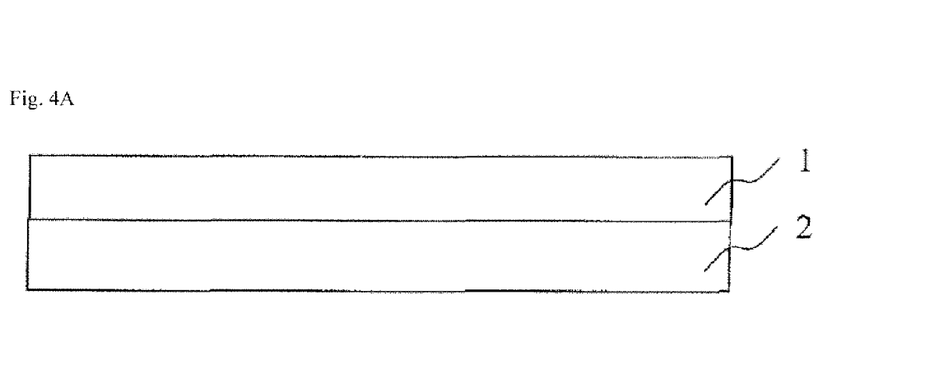
FIG. 4A is a schematic illustration of an embodiment wherein the dopant material layer is formed as a layer consisting of one dopant material.
Figure 4B:
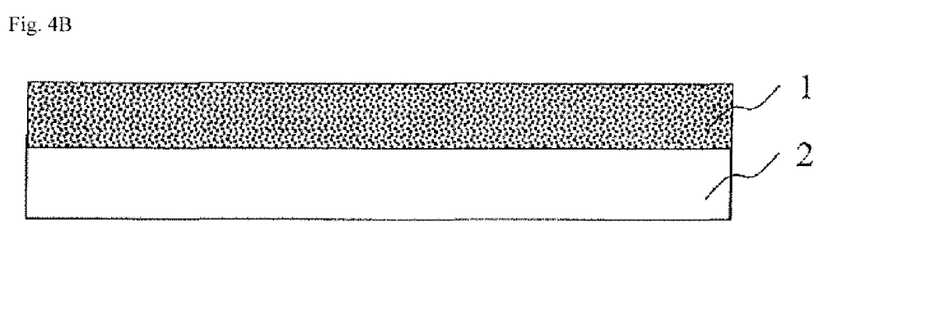
FIG. 4B is a schematic illustration of an embodiment wherein the dopant material layer is formed as a mixed layer comprising the dopant material and a further material in which the molecules of the dopant material are embedded.
Figure 4C:
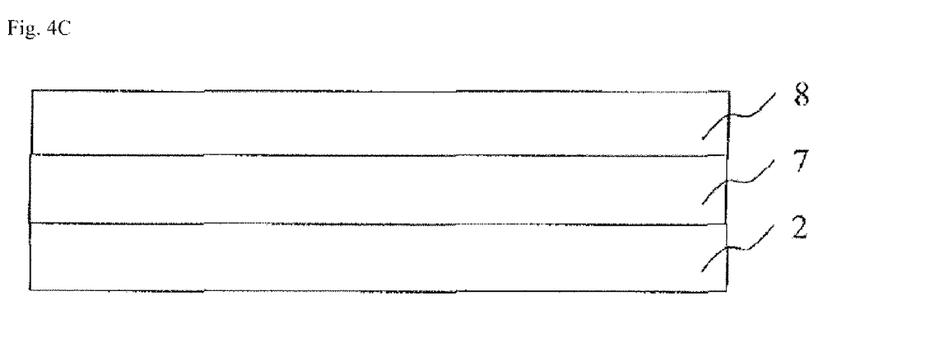
FIG. 4C is a schematic illustration of an embodiment wherein the dopant material layer is configured multi-layered.

FIGS. 4A, 4B, and 4C show, schematically different embodiments of the dopant material layer, in particular the encapsulation layer 1, in the organic field-effect transistors according to FIGS. 1 to 3.

FIG. 4A shows an embodiment wherein the dopant material layer is formed as a layer consisting of one dopant material. The molecules of the dopant material which constitute the dopant material layer in the embodiment of FIG. 4A comprise electrical dopants for the organic material of the active layer 2. The dopants can act as acceptors or donors. However, the dopant material is separated from the active layer 2 in a discrete layer, specifically the dopant material layer, which can be the encapsulation layer 1 or the charge carrier injection layer 11.

With the dopant material layer consisting of the dopant material, and a partial layer in the embodiment according to FIG. 4C below, a thicker layer formation or a higher concentration of the molecules of the dopant material lead to a greater background charge density in the active layer 2.

In the embodiment according to FIG. 4A, the dopant material layer, in particular the encapsulation layer 1, consists of a strong donor/acceptor. Electrons/holes are thereby transferred by the donor/acceptor into the LUMO level/HOMO level of the active layer 2, leading to a background charge density in the active layer 2. The thickness of the dopant material layer can be adjusted in order to increase the electron/hole mobility without significantly increasing the OFF currents of the organic field-effect transistor. The OFF currents increase greatly if the background charge density in the active layer 2 becomes too great.

Table 1 shows a preferred ON/OFF current ratio for an encapsulation layer 1 having a thickness of 1 nm. With a layer thickness of 2 nm, a strong rise in the OFF current was detected. Depending on the application, increased OFF currents can be accepted. Then the greater mobility that was detected for the layer thickness of 2 nm and the lower threshold voltage $V_{tH}$ are advantageous.

| Encapsulation layer thickness | Mobility (cm$^2$/Vs) | $V_{1H}$ (V) | OFF current (A) | Current at 30 V (A) | ON/OFF ratio |
|---|---|---|---|---|---|
| 0 nm | 0.042 | −14 | −3.30E−10 | −8.06E−07 | 2.44E+03 |
| 1 nm | 0.057 | −13 | −2.60E−10 | −1.8E−06 | 6.92E+03 |
| 2 nm | 0.10 | −12 | −9.70E−09 | −4.02E−06 | 4.14E+02 |

FIG. 4B shows an embodiment wherein the dopant material layer is formed as a mixed layer comprising the dopant material and a further material in which the molecules of the dopant material are embedded. The further material serves as a type of receptacle or carrier material for the dopants, but without electrical doping occurring in the dopant material layer itself. The carrier material can be configured transporting mainly charge carriers in the form of holes or mainly charge carriers in the form of electrons.

In these embodiments, the background charge density in the active layer 2 is also increased if the highest occupied molecular orbital (HOMO) (or the lowest unoccupied molecular orbital (LUMO)) of the molecules of the dopant material is energetically higher (lower) than the LUMO level (HOMO level) of the molecules of the matrix material, which also applies for the embodiment according to FIG. 4C as described below.

In this embodiment, also, the background charge density in the active layer 2 is increased if the LUMO level (HOMO level) of the molecules of the active layer is energetically lower (higher) than the LUMO level (HOMO level) of the molecules of the matrix material, which in turn also applies to the embodiment according to FIG. 4C, described below.

In these embodiments, the background charge density of the active layer 2 is also increased if the HOMO level (LUMO level) of the molecules of the dopant material is energetically higher (lower) than the LUMO level (HOMO level) of the molecules of the organic material of the active layer 2, which also applies to the embodiment according to FIG. 4C, described below.

The dopant material layer, in particular the encapsulation layer 1, is formed in the embodiment according to FIG. 4B as a mixed layer consisting of two components, wherein for an n-type/p-type organic field-effect transistor, one component represents a donor/acceptor for the organic material of the active layer 2. The second component of the encapsulation layer 1 is a matrix material which is electrically doped by the first component of the encapsulation layer 1, although this is not necessarily the case. In this embodiment, charge carriers are transferred directly from the donor/acceptor of the encapsulation layer 1 into the level/HOMO level of the active layer 2. In the event that the encapsulation layer 1 is itself embodied as an electrically doped layer, a part of the charge carriers is transferred from the donor/acceptor of the encapsulation layer 1 into the LUMO-level/HOMO level of the matrix material of the encapsulation layer 1. In the encapsulation layer 1, an additional charge carrier density is hereby generated and this is then partially transferred into the LUMO-level/HOMO-level of the adjacent active layer 2.

Finally, FIG. 4C shows an embodiment wherein the dopant material layer, in particular the encapsulation layer 1, is configured multi-layered. In the embodiment shown, a lower layer 7 and an upper layer 9 are provided. Similarly to the encapsulation layer 1 in the embodiment according to FIG. 3, the upper layer 9 consists of a dopant material. The lower layer 7 comprises a material which transports preferably holes or preferably electrons, similarly to the further material in the encapsulation layer 1 according to the embodiment of FIG. 4B.

Figure 5:
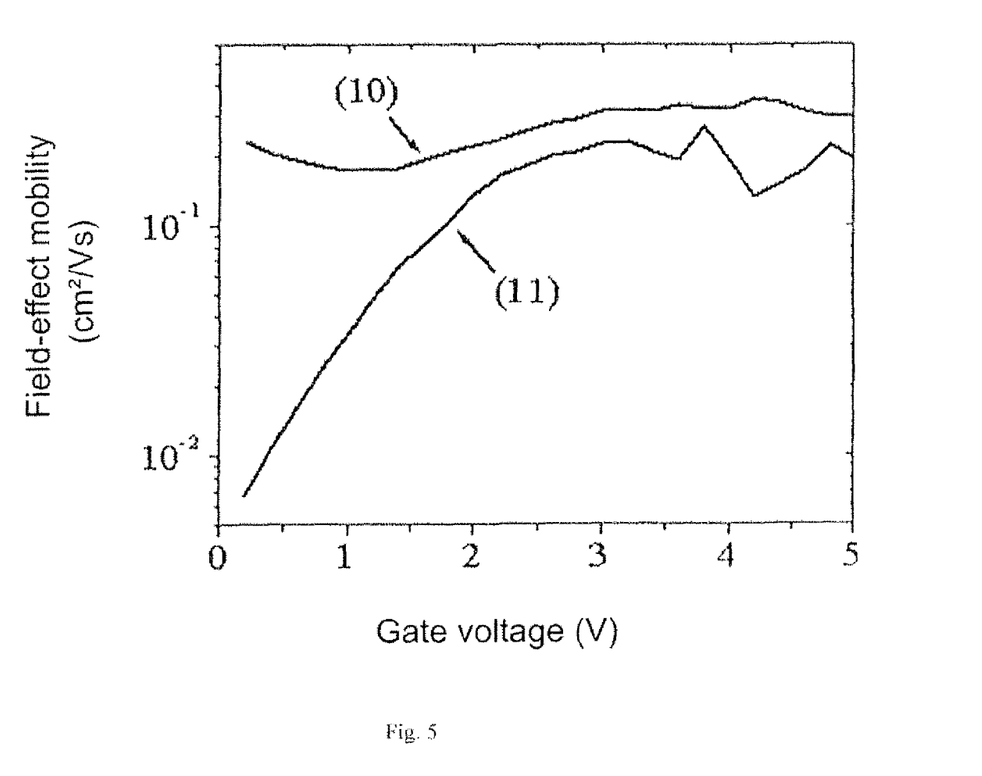
FIG. 5 is a graphical representation of the field-effect mobility against the gate voltage.

FIG. 5 shows a graphical representation of the variation of field-effect mobility against gate voltage. Curves are shown for an organic n-type field-effect transistor based on fullerene C60 in the embodiment according to FIGS. 2 and 4C (curve 10) and a known organic n-type field-effect transistor based on fullerene C60 (curve 11).

Figure 6:
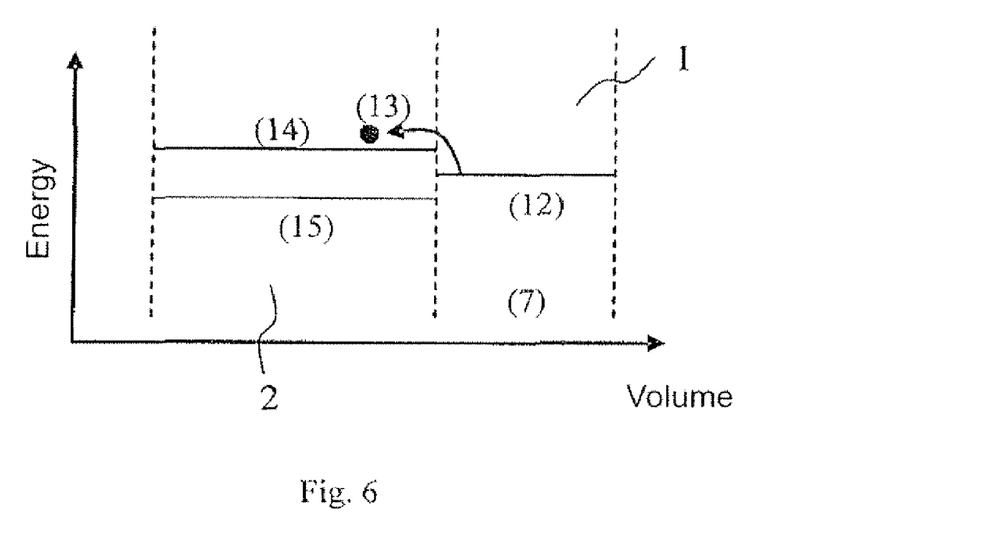
FIG. 6 is a schematic representation of energy levels and a charge transfer in conjunction with the embodiment of FIG. 4A.

FIG. 6 shows a schematic representation of energy levels and charge transfer in the context of the statements made with regard to FIG. 4A. The undisrupted energy levels of the individual layers before a charge transfer are shown. Represented here are the highest occupied molecular orbital (HOMO) of a donor 12 in the encapsulation layer 1, an electron transfer 13 into the active layer 2, a lowest unoccupied molecular orbital (LUMO) 14 of the active layer 2 and the Fermi level 15 of the active layer 2.

Figure 7:
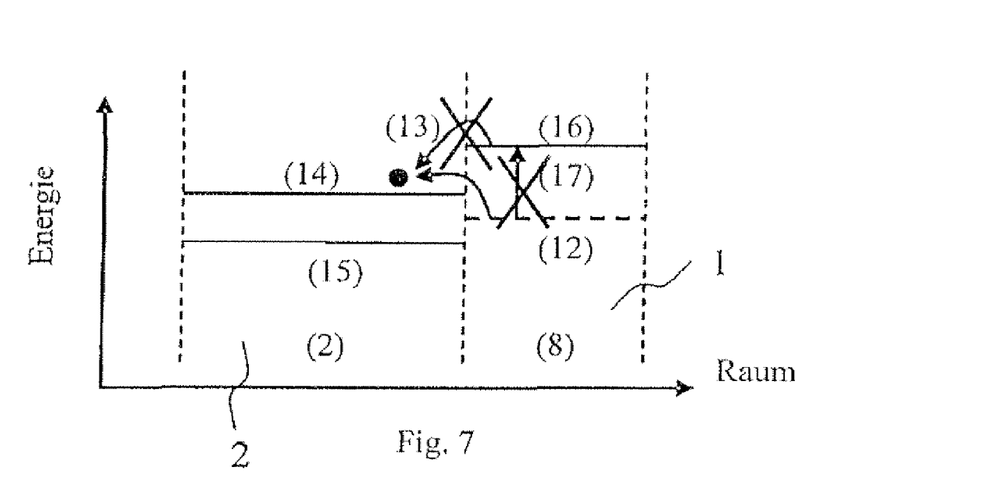
FIG. 7 is a schematic representation of energy levels and a charge transfer in conjunction with the embodiment of FIG. 4B.

FIG. 7 shows a schematic representation of energy levels and charge transfer in the context of the statements made with regard to FIG. 4B. The undisrupted energy levels of the individual layers are shown. Represented here are the LUMO level 16 of the further material in the encapsulation layer 1 according to the embodiment in FIG. 4B and an electron transfer 17 from the HOMO level 17 of the dopant material to the LUMO level 16 of the further material, which here is preferably implemented as transporting electrons, said electron transfer being less probable, due to a high barrier.

Figure 8:
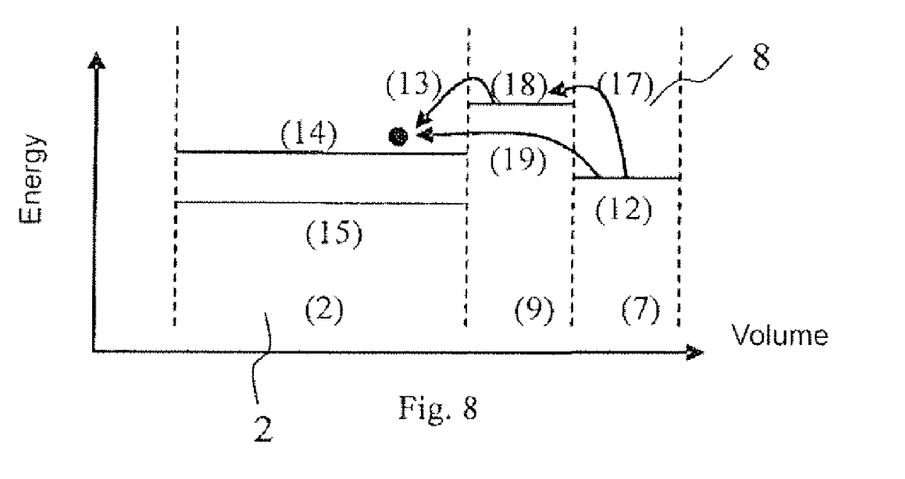
FIG. 8 is a schematic representation of energy levels and a charge transfer in conjunction with the embodiment of FIG. 4C.

FIG. 8 shows a schematic representation of energy levels and charge transfer in the context of the embodiment shown in FIG. 4C, it is the undisrupted energy levels of the individual layers before the charge transfer indicated with an arrow that are shown. Represented are the LUMO level 18 of the further material in the lower layer 7 according to FIG. 4C, which here is preferably implemented as transporting electrons, and an electron transfer 19 into the active layer 2 by means of a tunneling process through the lower layer 7. The tunneling process depends on the thickness of the lower layer 7. A lessening of the thickness of the lower layer 7 leads to an increase in the background charge density in the active layer 2.

The (matrix) material of the lower layer 7 is electrically doped by the dopant material in the upper layer 8, although this does not necessarily have to be the case. The dopant material for the quasi-doping of the active layer 2 is not in direct contact with the active layer 2 itself. Part of the charge carriers is spontaneously transferred from the dopant material from the upper layer 8 by means of tunneling into the LUMO/HOMO level of the active layer 2, which leads to the desired background charge density. In the event that the lower layer 7 is electrically doped by the dopant material, charge carriers can also be transferred into the LUMO/HOMO (matrix) material of the lower layer 7, which is configured to be preferably electron-transporting or preferably hole-transporting. In a further step, these charge carriers are partially transferred into the LUMO/HOMO of the active layer 2.

Figure 9:
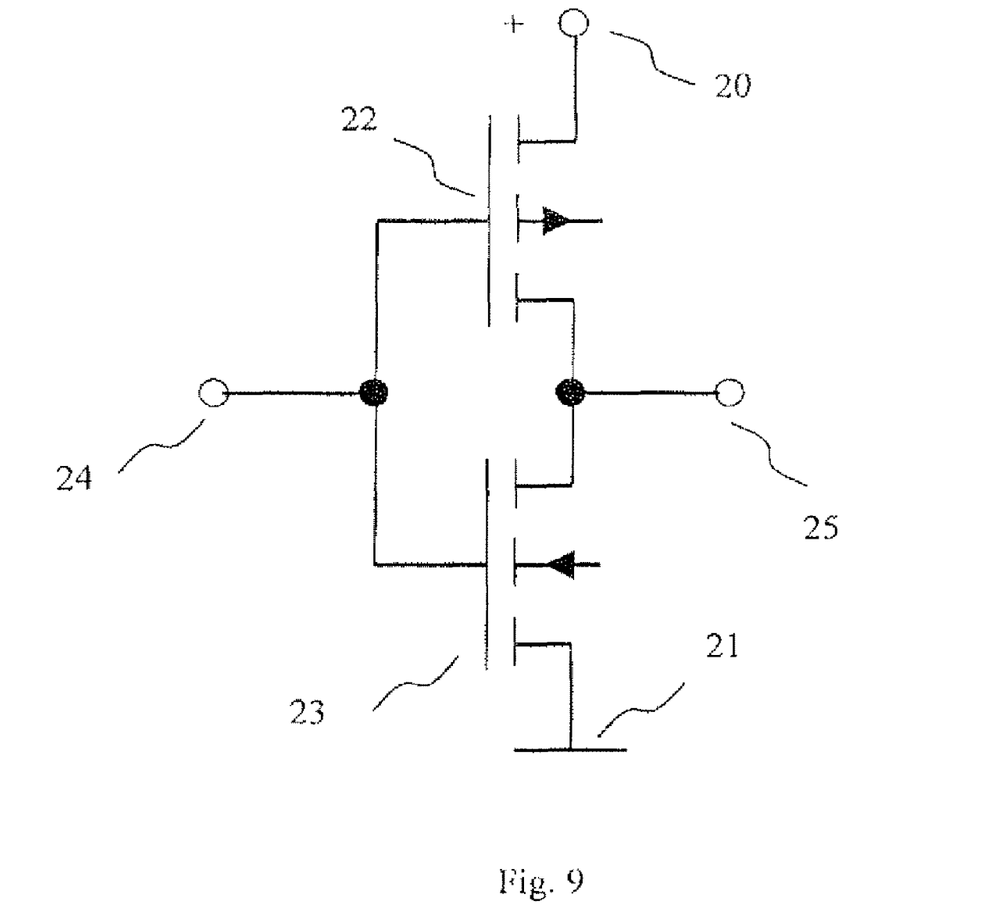
FIG. 9 is a schematic representation of a complementary inverter.

FIG. 9 shows an inverter. An n-type transistor 22 and a p-type transistor 23 are connected in series between a positive voltage supply VDD 20 and a negative voltage supply VSS (or earth) 21. The gate electrodes 24 are connected together electrically. When a positive voltage is applied to the gate electrode 24, the channel of the n-type transistor is blocked 22 and the channel of the p-type transistor 23 is opened (conductive), so that a load experiences the voltage VSS 21. On application of a negative voltage (or earth) to the gate electrode 24, the channel of the p-type transistor 23 is blocked and the channel of the n-type transistor 22 is opened (conductive) and a load experiences the voltage VDD 20.

Figure 10:
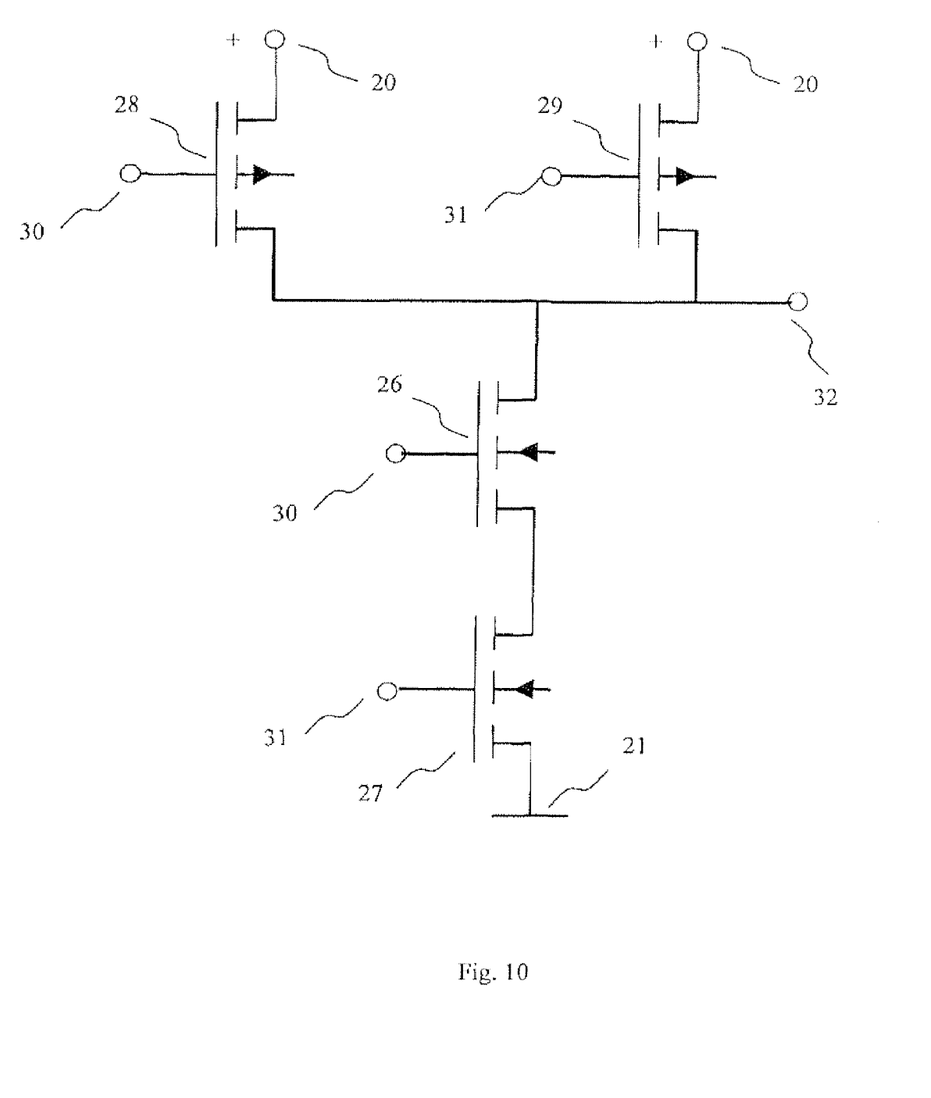
FIG. 10 is a schematic representation of a basic NAND (not and) circuit.

FIG. 10 shows a schematic representation of a basic NAND (NOT AND) circuit. If a "1" is applied (where "1"~VDD 20) to all gate electrodes 30, 31, the transistors 26, 27 are saturated (channel becomes conductive), and the transistors 28 and 29 are opened (very high resistance). Thus a load which is connected to an output 32 experiences a negative voltage (of approximately VSS 21). If one or both inputs 30, 31 are driven with a low voltage VSS (or a negative voltage, or earth), one or both transistors 28, 29 are saturated, these being connected in parallel; at the same time, one or both of the transistors 26, 27 are blocked (they are connected in series). Therefore a load which is connected to the output 32 experiences a positive voltage (of approximately VDD 20).

It should be noted that the threshold voltage of the two digital states is dependent on the transistor properties. It is also known to a person skilled in the art that the negative voltage supply can optionally be earth.

The circuit in FIG. 9 is a basic element for constructing highly efficient ring oscillators which, due to their high mobility, can reach a high frequency and, due to the complementary logic circuit, have a very low current consumption.

The circuit of FIG. 10 is a basic element for constructing complementary logic circuits (OR, NOR, AND, XOR), wherein such complementary logic circuits can also be constructed with other transistor circuits which use the transistor described herein.

Further exemplary embodiments will now be described in detail.

Example 1

A highly doped Si substrate with a 300 nm thick layer of $SiO_2$ was used to produce the transistor. Part of the Si surface was cleaned of native $SiO_2$ in order to create the electrical contact to the gate electrode. This contact was achieved by means of conventional methods. The geometrical dimension of the electrode is defined using photolithography. Using conventional thermal evaporation (which can also be carried out by means of sputtering), initially a thin layer of Cr was vapor deposited (ca. 5 nm thick), followed by a layer of Au (approximately 100 nm thick). The electrodes were defined by lifting off the photoresist. The electrodes can also be formed with a fork structure in order to increase the channel width. The distance between the electrodes was 200 um. In the channel region, the organic material of the active layer, in this case pentacene, was deposited (40 nm thick) by vacuum evaporation. A shadow mask was used in order to keep free parts of the Au electrodes in order to ensure electrical contact with the measuring apparatus. The previously described process was used to produce a transistor according to the prior art. The measured hole mobility in the known transistor was 0.05 $cm^2$/Vs.

Example 2

At the same time a second transistor was produced which comprised a second organic layer which was deposited onto the pentacene layer. A 40 nm-thick mixed layer was vapor deposited between CBP and F4TCNQ (4% by mass), wherein, in this case, CBP is a non-electrically active matrix material and F4TCNQ is a dopant for pentacene. This mixed layer is not a doped layer, since CBP has a HOMO=−5.90 eV and a LUMO=−2.6 eV, and the LUMO of F4TCNQ is approximately −5.2 eV. With this large energetic barrier, the HOMO or CBP lies 0.7 eV below the LUMO of F4TCNQ, so that no charge transfer and no electrical doping take place. The measured hole mobility in the transistor was 0.1 $cm^2/Vs$. Mobility was doubled in this transistor.

Example 3

A transistor was produced as per Example 2, wherein the active layer was a 20 nm-thick C60 layer. A 5 nm-thick layer of CBP was vapor deposited over the active layer. A 2 nm-thick layer of "acridine orange base" (3,6-bis(dimethylamino) acridine, AOB, HOMO=3.5 eV) was vapor deposited thereon. The measured electron mobility in the inventive transistor was 0.08 $cm^2/Vs$. A transistor without the CBP/AOB layer was produced for comparison, and the measured electron mobility of C60 is 0.005 $cm^2/Vs$.

Example 4

A transistor was produced as per Example 2, wherein the active layer was a 20 nm-thick C60 layer. A 20 nm-thick layer of CBP mixed with AOB (4% molar concentration) was vapor deposited onto the active layer by means of mixed evaporation. The measured electron mobility in the transistor was 0.1 $cm^2/Vs$.

Example 5

A complementary inverter was constructed with the transistors according to Example 2 (as n-type transistors 22) and 3 (as p-type transistors 23). The inverter functions as mentioned with an input voltage of 0-20% Vdd for logical "0" and of 50% to Vdd for logical "1". It was supplied with 5V (VDD 20) and tested with a 1 kHz square-wave TTL signal at input 24 via 10E6 circuits.

Example 6

A NAND (NOT AND) basic circuit was produced in that two transistors according to Example 2 (28 and 29) were connected in parallel (drain electrode to drain electrode and source electrode to source electrode). The parallel connection was connected to Vdd and connected in series to two (also series-connected) transistors (30 and 31) according to Example 3, wherein the open source electrode was connected to earth. The gate electrodes of the transistors 26, 28 were connected together electrically, forming the input 30. The gate electrodes of the transistors 27, 29 were electrically contacted, forming the input 31. The circuit was tested and it was found that it functioned, as expected, as a NAND circuit.

Further exemplary embodiments will now be described.

The following are examples of organic materials which can be used for the layer 2: fullerene C60 and C70 and derivatives thereof; pentacene and derivatives thereof; rubrene; oligothiophenes and derivatives thereof; phthalocyanines and metallophthalocyanines and their derivatives; PTCDI, perylenetetracarboxylic diimide, and derivatives thereof; PPV, poly(p-phenylenevinylene), and derivates thereof; PTV, poly(2,5-thienylenevinylene) and derivates thereof; P3HT,poly(3-hexythiophene) and derivates thereof; PFO, poly(9,9-dioetylfluorene) and derivates thereof; PCMB, [6,6]-phenyl C61-butyric acid methyl ester, and derivatives thereof.

The following are examples of matrix materials for the encapsulation layer 1 configured as a mixed layer in the configuration according to FIG. 3*b*: Alq3, tris-(8-hydroxyquinoline)aluminum and derivatives thereof; Bphen, 4,7-diphenyl-1,10-phenanthroline, and derivatives thereof; octaethylporphyrin and metallooctaethylporphyrins, and derivates thereof; NTCDA, 1,4,5,8-naphthalenetetracarboxylic dianhydride, and derivates thereof; TPD, 4,4'-bis(3-methylphenylphenylamino)biphenyl, and derivatives thereof; NPD, N,N'-diphenyl-N,N'-bis(1-naplithyl)-1,1'-biphenyl-4,4-diamine, and derivatives thereof; tetraphenylporphyrin and metallotetraphenylporphyrins, and derivates thereof; Spiro-TAD, 2,2',7,7'-tetrakis(N,N-diphenylamino)-9,9'-spirobifluorene; 4,4',4''-tris(N-carbazolyl)triphenylamine; CBC, 4,4-bis(carbazol-9-yl)biphenyl; and UGH2, 1,4-bis(triphenylsilyl)benzene.

The following materials are examples of donors which are capable of completing a charge transfer with the molecules of the active layer 2 under normal circumstances: Ru(terpy)2, bis(2,2':6',2''-terpyridine)ruthenium and tetrakis(1,3,4,6,7,8-hexahydro-2H-pyrimido[1,2-a]pyrimidiato)ditungsten.

The following materials are examples of acceptors that are capable of completing a charge transfer with the molecules of the active layer 2 under normal conditions: F4-TCNQ, 2,3,5, 6-tetrafluoro-7,7,8,8,-tetracyanoquinodimethane, and N,N'-dicyano-2,3,5,6,7,8-hexalluoro-1,4-naphthoquinonediimine.

Embodiments of the aspects of the invention described can be provided in order to control the efficiency of the charge transfer from the dopant material layer into the active layer 2. The background charge density induced hereby in the electrically undoped active layer 2 determines the increase of the mobility in the active layer 2 and the dependence of the field-effect mobility on the gate voltage in the organic field-effect transistor.

The features of the invention disclosed in the above description, the claims and the drawings can be significant to the realization of the invention in its various embodiments either individually or in any combination.

The invention claimed is:

1. An organic field-effect transistor comprising:
   a gate electrode, a drain electrode and a source electrode,
   a dielectric layer, wherein the dielectric layer is in contact with the gate electrode,
   an active layer comprising an organic material, wherein the active layer is in contact with the drain electrode and the source electrode, wherein the active layer is electrically undoped, and wherein the active layer comprises a conduction channel between the drain electrode and the source electrode during operation,
   a dopant material layer, wherein the dopant material layer comprises a dopant material that is an electrical dopant for the organic material of the active layer, and
   a border surface region wherein a planar contact exists between the conduction channel of the active layer and the dopant material layer, and wherein a mobility of electrical charge carriers in the dopant material layer is no more than half a mobility of electrical charge carriers in the active layer.

2. The field-effect transistor according to claim 1, wherein the dopant material layer consists of the dopant material.

3. The field-effect transistor according to claim 1, wherein the dopant material layer is embedded in a matrix material for which the dopant material is not an electrical dopant.

4. The field-effect transistor according to claim 3, wherein an energy difference for charge transfer between the dopant material and the matrix material is greater than about 0.5 eV.

5. The field-effect transistor according to claim 1, wherein the dopant material layer comprises multiple layers, wherein one partial layer consists of the dopant material and another partial layer, which is arranged between the partial layer and the active layer and is in contact with the partial layer and the active layer consists of a matrix material which transports the charge carrier.

6. The field-effect transistor according to claim 4, wherein the matrix material transporting charge carriers comprises a material which transports electrons.

7. The field-effect transistor according to claim 4, wherein the matrix material transporting charge carriers comprises a material which transports holes.

8. The field-effect transistor according to claim 1, wherein the dopant material layer is in direct contact with the drain electrode and the source electrode.

9. The field-effect transistor according to claim 1, wherein, in a switched-on state in which the conduction channel is in the active layer, an electrical conductivity in the active layer is greater than in the dopant material layer by at least a factor of two.

10. The field-effect transistor according to claim 1, wherein the dopant material is a molecular dopant material which comprises at least two different atoms.

11. The field-effect transistor according to claim 10, wherein the molecular dopant material has a molar mass of between about 100 g/mol and about 2000 g/mol.

12. The field-effect transistor according to claim 1, wherein an energetic difference between the highest occupied orbital of the molecules (HOMO) of the organic material of the active layer and the lowest unoccupied orbital of the molecules (LUMO) of the dopant material is greater than about −0.5 eV if the dopant material for the organic material of the active layer is an acceptor.

13. The field-effect transistor according to claim 1, wherein an energetic difference between the lowest unoccupied orbital of the molecules (LUMO) of the organic material of the active layer and the highest occupied orbital of the molecules (HOMO) of the dopant material is less than about 0.5 eV if the dopant material for the organic material of the active layer is a donor.

14. The field-effect transistor according to claim 1, wherein the dopant material layer comprises an encapsulation layer.

15. The field-effect transistor according to claim 14, wherein the encapsulation layer is free from direct contact with the drain electrode and the source electrode.

16. The field-effect transistor according to claim 1, wherein the dopant material layer comprises a charge carrier injection layer in direct contact with the drain electrode and the source electrode.

* * * * *